(12) United States Patent
Bedeschi et al.

(10) Patent No.: US 11,869,565 B2
(45) Date of Patent: *Jan. 9, 2024

(54) READ ALGORITHM FOR MEMORY DEVICE

(71) Applicant: Micron Technology, Inc., Boise, ID (US)

(72) Inventors: Ferdinando Bedeschi, Biassono (IT); Umberto Di Vincenzo, Capriate San Gervasio (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/056,516

(22) Filed: Nov. 17, 2022

(65) Prior Publication Data

US 2023/0084481 A1 Mar. 16, 2023

Related U.S. Application Data

(63) Continuation of application No. 16/908,299, filed on Jun. 22, 2020, now Pat. No. 11,527,279.

(51) Int. Cl.
*G11C 11/22* (2006.01)
*G06F 11/07* (2006.01)

(52) U.S. Cl.
CPC ...... *G11C 11/2273* (2013.01); *G06F 11/0727* (2013.01); *G06F 11/0751* (2013.01); *G11C 11/221* (2013.01); *G11C 11/2259* (2013.01)

(58) Field of Classification Search
CPC .............. G11C 11/2273; G11C 11/221; G11C 11/2259; G06F 11/0727; G06F 11/0751

(Continued)

(56) References Cited

U.S. PATENT DOCUMENTS

| 6,567,318 B2 | 5/2003 | Bedarida et al. |
| 7,643,347 B2 | 1/2010 | Abiko et al. |

(Continued)

FOREIGN PATENT DOCUMENTS

| KR | 10-2014-0006596 A | 1/2014 |
| TW | 202013369 A | 4/2020 |

OTHER PUBLICATIONS

International Search Report and Written Opinion received for PCT Patent Application No. PCT/US21/36626, dated Sep. 24, 2021, 7 pages.

(Continued)

*Primary Examiner* — Huan Hoang
(74) *Attorney, Agent, or Firm* — Holland & Hart LLP

(57) ABSTRACT

Methods, systems, and devices for a read algorithm for a memory device are described. When performing a read operation, the memory device may access a memory cell to retrieve a value stored by the memory cell. The memory device may compare a set of reference voltages with a signal output by the memory cell based on accessing the memory cell. Thus, the memory device may determine a set of candidate values stored by the memory cell, where each candidate value is associated with one of the reference voltages. The memory device may determine and output the value stored by the memory cell based on determining the set of candidate values. In some cases, the memory device may determine the value stored by the memory cell based on performing an error control operation on each of the set of candidate values to detect a quantity of errors within each candidate value.

20 Claims, 8 Drawing Sheets

(58) Field of Classification Search
USPC .......................................................... 714/54
See application file for complete search history.

(56) References Cited

U.S. PATENT DOCUMENTS

| | | |
|---|---|---|
| 11,527,279 B2* | 12/2022 | Bedeschi ............ G11C 11/2273 |
| 2001/0028586 A1 | 10/2001 | Mullarkey et al. |
| 2005/0146948 A1 | 7/2005 | Hose et al. |
| 2012/0163073 A1 | 6/2012 | Franca-Neto et al. |
| 2014/0126294 A1 | 5/2014 | Yang |
| 2015/0179284 A1 | 6/2015 | Alrod et al. |
| 2017/0271031 A1 | 9/2017 | Sharon et al. |
| 2019/0286518 A1 | 9/2019 | Asami et al. |
| 2021/0383886 A1 | 12/2021 | Alrod et al. |

OTHER PUBLICATIONS

Taiwan Intellectual Property Office, "Office Action," issued in connection with (Taiwan) Patent Application No. 110119937, dated Nov. 29, 2021 (3 pages).

* cited by examiner

READ ALGORITHM FOR MEMORY DEVICE

CROSS REFERENCE

The present Application for Patent is a continuation of U.S. patent application Ser. No. 16/908,299 by Bedeschi, et al., entitled "READ ALGORITHM FOR MEMORY DEVICE", filed Jun. 22, 2020, which is assigned to the assignee hereof, and each of which is expressly incorporated by reference in its entirety herein.

BACKGROUND

The following relates generally to one or more systems for memory and more specifically to a read algorithm for a memory device.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
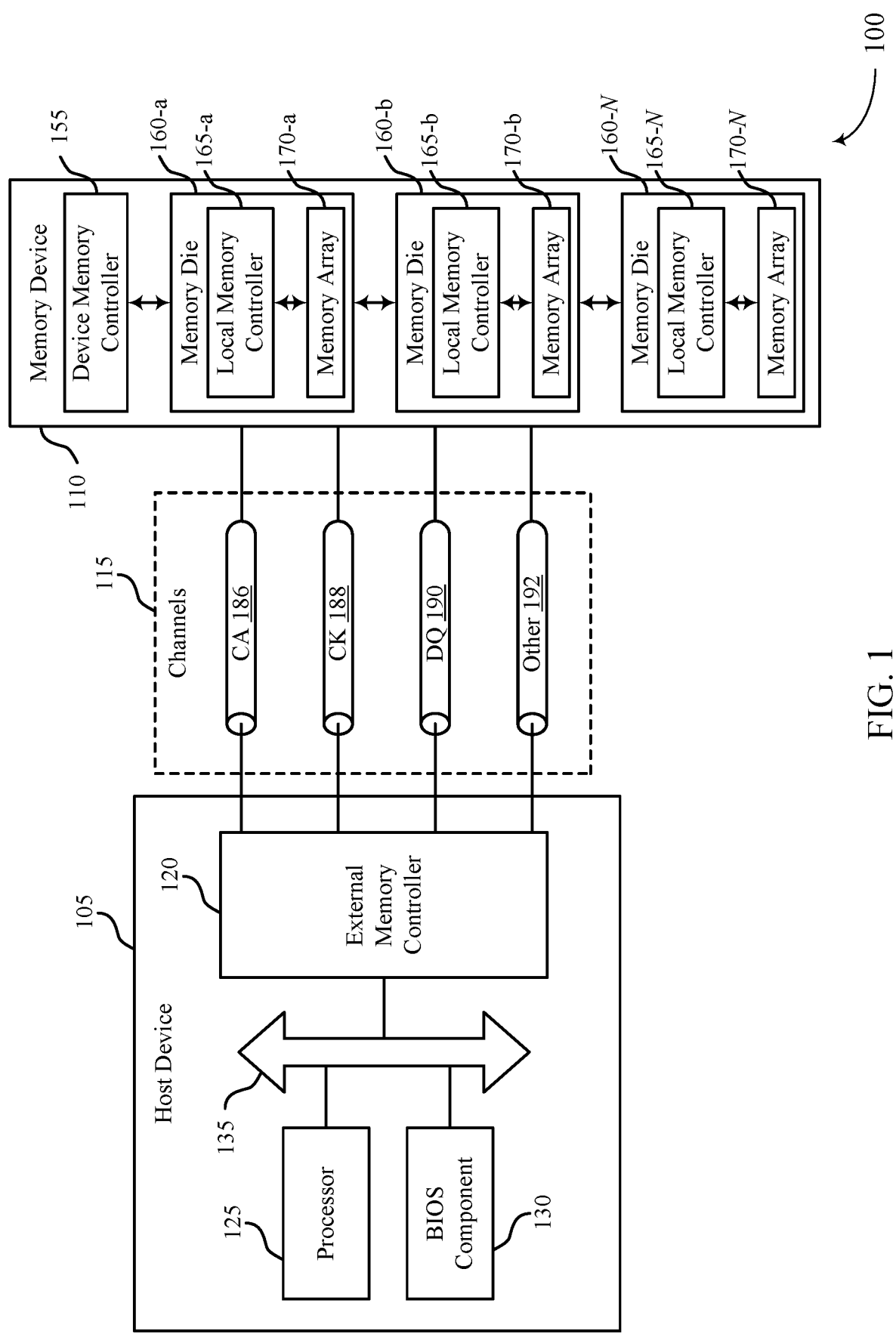
FIG. 1 illustrates an example of a system that supports a read algorithm for a memory device in accordance with examples as disclosed herein.

When performing a read operation, a memory device may access a memory cell that may output a signal to a sense component based on a value stored by the memory cell. To determine the value stored by the memory cell, the sense component may compare the signal output by the memory cell to a reference voltage. Here, the reference voltage may correspond to a voltage positioned between an expected voltage level of the signal output by a memory cell storing a first logic value and an expected voltage level of the signal output by a memory cell storing a second logic value. Thus, the memory device may determine that the memory cell was storing a first logic value if the signal output by the memory cell is less than the reference voltage. Additionally, the memory device may determine that the memory cell was storing a second logic value if the signal output by the memory cell is greater than the reference voltage. In some cases, the signal output by the memory device may be different than the expected voltage level associated with the value stored by the memory cell. For example, the memory cell may be storing a stuck bit. In another example, the characteristic of the memory cell may change over time, resulting in a corresponding change in the signal output by the memory cell based on the value stored by the memory cell. In some other examples, the signal output by a memory cell may change from the expected value based on other operating conditions (e.g., temperature). Such unintentional changes in the state stored in the memory cell may be referred to as errors. In these cases, comparing the signal output by the memory cell to a single reference voltage may result in one or more errors during the read operation.

In examples described herein, the memory device may compare the signal output by the memory cell to more than one reference voltage (e.g., three reference voltages, four reference voltages, five reference voltages) concurrently. Thus, the sense component may determine a candidate value stored in the memory cell based on comparing the signal output from the memory cell with each of the reference voltages. The memory device may then determine the value stored by the memory cell based on the set of candidate values. For example, the memory device may perform an error control operation (e.g., an error detection operation or an error correction operation) based on each of the candidate values and identify a quantity of detected errors in each of the candidate values. The memory device may select one of the candidate values associated with a lowest detected error quantity. Additionally, the memory device may determine the value stored by the memory cell based on a mode value of the candidate values. By comparing the signal output by the memory cell to more than one reference voltage, the read operation may be associated with a higher reliability when compared to a read operation where the signal output by the memory cell is compared to a single voltage.

Features of the disclosure are initially described in the context of systems and dies as described with reference to FIGS. 1-2. Features of the disclosure are described in the context of a memory device, a system, a circuit, and a voltage distribution plot as described with reference to FIGS. 3-6. These and other features of the disclosure are further illustrated by and described with reference to an apparatus diagram and a flowchart that relate to a read algorithm for a memory device as described with reference to FIGS. 7 and 8.

FIG. 1 illustrates an example of a system 100 that supports a read algorithm for a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

When performing a read operation, the memory device 110 may access one or more memory cells within a memory array 170. The memory device 110 may compare a signal output by the accessed memory cells to more than one reference voltage (e.g., three reference voltages, four reference voltages, five reference voltages). Thus, the memory device 110 may generate a candidate value stored in the memory cells associated with each of the reference voltages. The memory device 110 may then determine the value stored by the memory cells based on the set of candidate values. For example, the memory device 110 may perform an error control operation based on each of the candidate values and identify a quantity of detected errors in each of the candidate values. The memory device 110 may select one of the candidate values associated with a lowest detected error quantity. Additionally, the memory device 110 may determine the value stored by the memory cells based on a mode value of the candidate values. By comparing the signal output by the memory cell to more than one reference voltage concurrently, the read operation may exhibit a higher reliability when compared to a read operation that compares the signal output by the memory cells with a single reference voltage.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
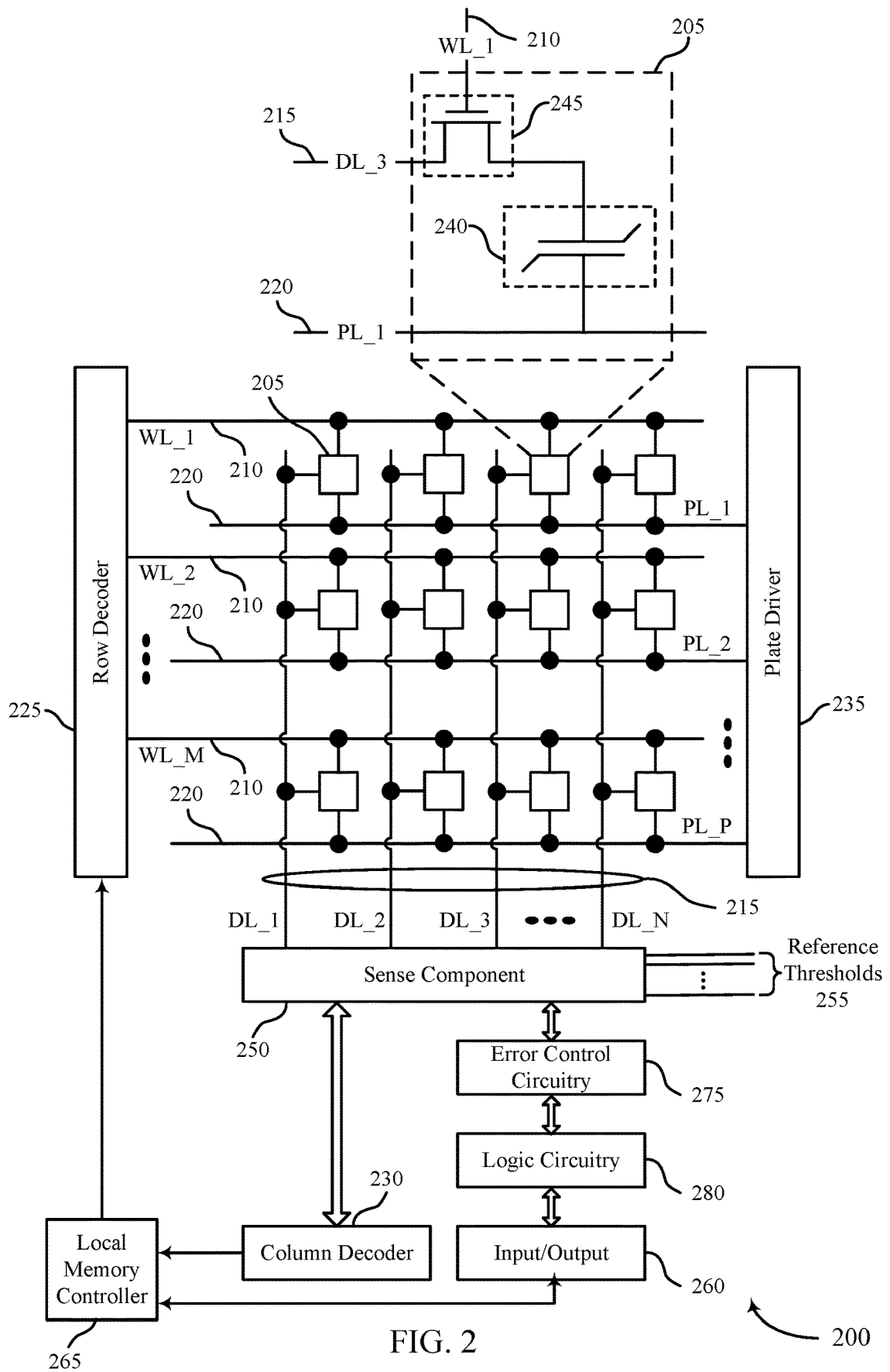
FIG. 2 illustrates an example of a memory die that supports a read algorithm for a memory device in accordance with examples as disclosed herein.

FIG. 2 illustrates an example of a memory die 200 that supports a read algorithm for a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a candidate logic state of the memory cell 205 based on the detected state. The sense component 250 may include one or more sense amplifiers to amplify the signal output of the memory cell 205. The sense component 250 may compare the signal received from the memory cell 205 across the digit line 215 to one or more reference thresholds 255 (e.g., reference voltages). The sense component 250 may generate a candidate logic state associated each of the reference thresholds 255. Thus, the sense component 250 may output a set of candidate logic states to the error control circuitry 275.

The error control circuitry 275 may perform an error control operation on each of the candidate logic states received from the sense component 250 (e.g., when more than one memory cell is accessed and the candidate logic state is associated with a logic state of more than one memory cell). Examples of an error control operation may include an error detection operation, an error correction operation, or a combination thereof. Thus, the error control circuitry 275 may output each of the candidate logic states and a quantity of errors detected with each to the logic circuitry 280. Logic circuitry 280 may determine the logic state of the memory cell 205 (e.g., based on the set of candidate logic states and quantity of errors associated with each candidate logic state). The determined logic state of the memory cell 205 may be provided as an output of the logic circuitry 280 (e.g., to an input/output 260), and may indicate the determined logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to each of the reference thresholds 255. Based on that comparison, the sense component 250 may output a set of candidate values to the error control circuitry 275 (e.g., each associated with one of the reference thresholds 255). The error control circuitry 275 may determine a quantity of errors associated with each of the candidate values and output the set of candidate values and associated quantity of errors to the logic circuitry 280. The logic circuitry 280 may determine the logic state of the memory cell 205 based on the set of candidate values and, in some cases, based on the quantity of detected errors associated with each of the candidate values.

Figure 3:
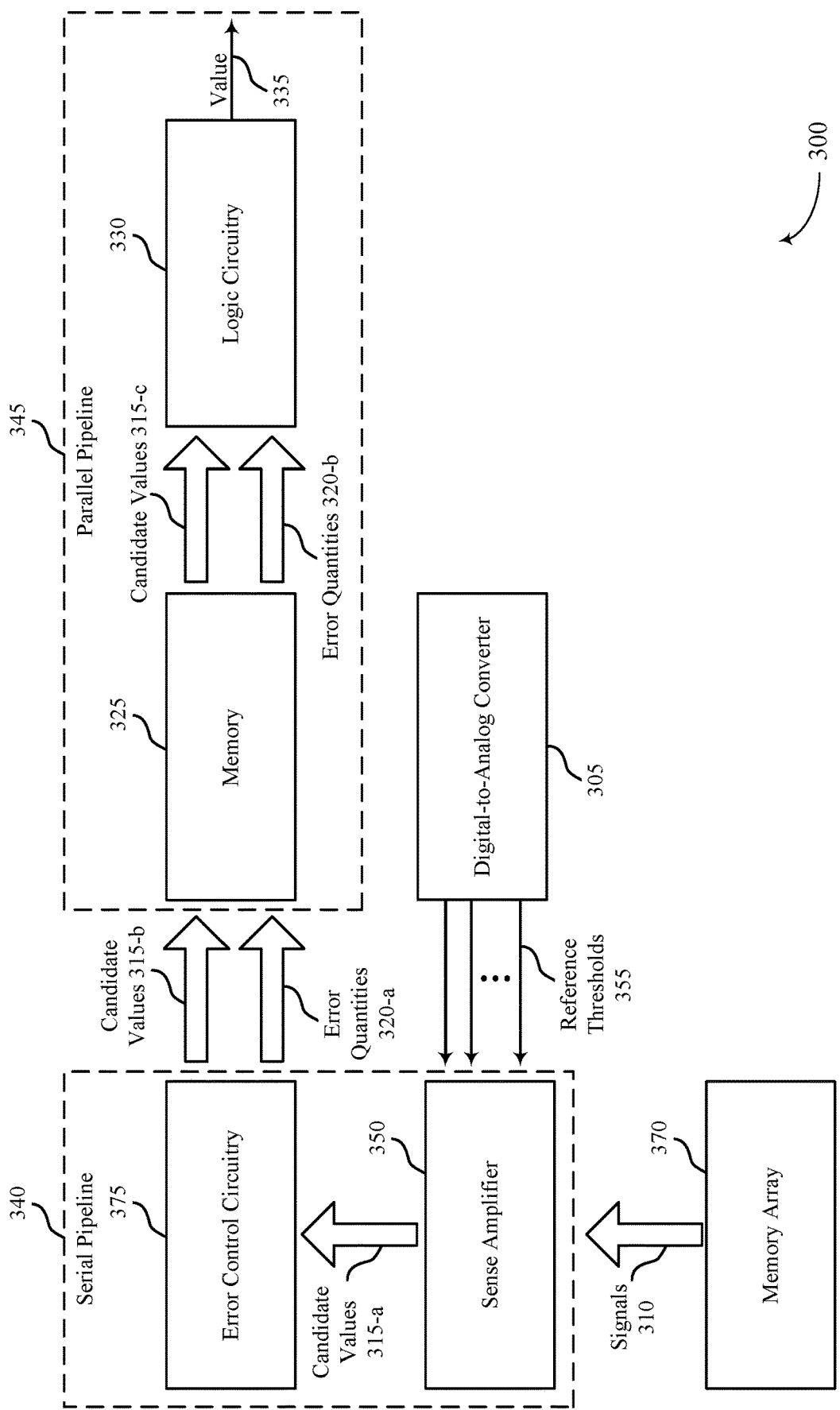
FIG. 3 illustrates an example of a block diagram of a memory device that supports a read algorithm for a memory device in accordance with examples as disclosed herein.

FIG. 3 illustrates an example of a block diagram of a memory device 300 that supports a read algorithm for a memory device in accordance with examples as disclosed herein. The memory device 300 may be an example of a memory device as described with reference to FIG. 1. In some cases, the memory device 300 may include one or more components as described with reference to FIGS. 1 and 2. For example, the memory array 370 may be an example of a memory array 170, the reference thresholds 355 may be examples of the reference thresholds 255, the sense amplifier 350 may be an example of the sense component 250, the error control circuitry 375 may be an example of the error control circuitry 275, and the logic circuitry 380 may be an example of the logic circuitry 280. The memory device 300 may also include a digital-to-analog converter 305 and memory 325.

The digital-to-analog converter 305 may be a peripheral digital-to-analog converter 305 or a complementary metal-oxide-semiconductor (CMOS) under array (CuA). In some cases, the digital-to-analog converter 305 may be integrated with another component. For example, the digital-to-analog converter 305 may be integrated with a device memory controller or local memory controller as described with reference to FIGS. 1 and 2. During a read operation, the digital-to-analog converter 305 may supply the set of reference thresholds 355 to the memory array and sense amplifier 350 (e.g., as described with reference to FIG. 2). Each reference threshold 355 may correspond to a different voltage. For example, the reference thresholds 355 may include a first voltage (e.g., 1.4V), a second voltage (e.g., 1.5 V), and a third voltage (e.g., 1.6V). In some cases, the digital-to-analog converter 305 may supply a set of reference thresholds 355 (e.g., predefined reference voltages) to the memory array and sense amplifier 350. For example, the set of reference thresholds 355 may be defined during a manufacturing phase. In some other cases, the digital-to-analog converter 305 may dynamically adjust a set of reference thresholds 355 supplied to the memory array and sense amplifier 350.

In some cases, the memory device 300 may perform a read operation. For example, the memory device 300 may receive a read command (e.g., from a host device as described with reference to FIG. 1) and perform the read operation in response. In some cases, the read command may include an indication of one or more memory cells within the memory array 370 to be read during an execution of the read operation. The memory device 300 may access the indicated memory cells in the memory array 370. Based on accessing the memory cells in the memory array 370, the memory array 370 may output signals 310 to the sense amplifier 350. For example, the memory array 370 may output a signal 310 associated with each accessed memory cell.

The sense amplifier 350 may receive the signals 310 from the memory array 370. The sense amplifier 350 may amplify the signals 310 and compare the signals 310 to the reference thresholds 355 supplied by the digital-to-analog converter 305. Based on comparing the signals 310 to each of the reference thresholds 355, the sense amplifier 350 may generate the candidate values 315-$a$. For example, the sense amplifier 350 may compare the signals 310 to a first reference threshold 355 and generate a first candidate value 315-$a$. Additionally, the sense amplifier 350 may compare the signals 310 to one or more additional reference thresholds 355 to generate additional candidate values 315-$a$. In some examples, the sense amplifier 350 may compare the signals 310 to each of the reference thresholds 355 in parallel. That is, the sense amplifier 350 may compare the signals 310 to the first reference threshold 355 during a time period that at least partially overlaps with a time period during which the sense amplifier 350 compares the signals 310 to the one or more additional reference thresholds 355. In some other examples, the sense amplifier 350 may compare the signals 310 to each of the reference thresholds 355 serially. That is, the sense amplifier 350 may compare the signals 310 to the first reference threshold 355 prior to comparing the signals 310 to the one or more additional reference thresholds 355.

In some instances, the sense amplifier 350 may generate candidate values 315-$a$ that each contain the same values. For example, when the sense amplifier 350 compares the signals 310 to the different reference thresholds 355, the sense amplifier 350 may generate a set of identical candidate values 315-$a$. In some other instances, the sense amplifier 350 may generate one or more of the candidate values 315-$a$ that are different than another candidate value 315-$a$. That is, when the sense amplifier 350 compares the signals 310 to a first reference threshold 355, the sense amplifier 350 may generate a different candidate value 315-$a$ than when the sense amplifier 350 compares the signals 310 to a second reference threshold 355.

The sense amplifier 350 may output the candidate values 315-$a$ to the error control circuitry 375. The error control circuitry 375 may perform an error control operation on each of the candidate values 315-$a$. Thus, the error control circuitry 375 may detect an error quantity 320 within each of the candidate values 315-$a$. In some cases, the error control circuitry 375 may be configured to detect up to two errors within a candidate value 315-$a$. Thus, in a case that the candidate value 315-$a$ contains more than two errors, the error control circuitry 375 may detect zero, one, or two errors within the candidate value 315-$a$. In some other cases, the error control circuitry 375 may be configured to detect more than two errors within the candidate values 315-$a$. In either case, the error control circuitry 375 may output candidate values 315-$b$ (e.g., corresponding to the candidate values 315-$a$) and error quantities 320-$a$. For example, the error control circuitry 375 may output an error quantity 320-$a$ associated with each of the candidate values 315-$b$.

The memory 325 may receive the candidate values 315-$b$ and the error quantities 320-$a$ from the error control circuitry 375. The memory 325 may include one or more registers to temporarily store the candidate values 315-$b$ and the corresponding error quantities 320-$a$. The memory 325 may be an example of any memory technology capable of storing information. In some cases, the memory 325 may be an example of a scratch memory that may be used for the storage of temporary data. In some examples, such a scratch memory may be less reliable than other types of memory and may not include a backup. In some cases, the memory 325 may be erased at periodic intervals.

The sense amplifier 350 and the error control circuitry 375 may make up a serial pipeline 340. For example, the sense amplifier 350 may output each of the candidate values 315-$a$ to the error control circuitry 375 serially. Here, the error control circuitry 375 may perform the error control operation on each of the candidate values 315-$a$ serially. For example, the error control circuitry 375 may receive a first candidate value 315-$a$ from the sense amplifier 350 and perform a first error control operation to detect a first error quantity 320-$a$ associated with the first candidate value 315-$a$. The error control circuitry 375 may output the first candidate value 315-*a* and first error quantity 320-*a* to the memory 325 for storage. The error control circuitry 375 may then receive a second candidate value 315-*a* from the sense amplifier 350 and perform a second error control operation.

If the error control circuitry 375 performs an error control operation on one of the candidate values 315-*a* and detects that the candidate value contains no errors, the error control circuitry 375 may output that candidate value 315-*a* (e.g., to an input/output as described with reference to FIG. 2). In this example, the memory device 300 may complete the execution of the read operation by communicating the value (e.g., corresponding to the candidate value 315-*a* containing no errors) to the host device. Here, the error control circuitry 375 may not continue to perform error control operations on the remaining candidate values 315-*a* and output the candidate values 315-*b* and error quantities 320-*a* to the memory 325. In some cases, this may conserve power when compared to a memory device 300 that continues performing error control operations on the remaining candidate values 315-*a* after detecting a candidate value 315-*a* with no errors.

In a case that the error control circuitry 375 fails to identify a candidate value 315-*a* with no errors, the error control circuitry 375 may communicate candidate values 315-*b* and error quantities 320-*a* corresponding to each of the candidate values 315-*a* to the memory 325. The memory 325 may in turn communicate candidate values 315-*c* and error quantities 320-*b* to the logic circuitry 330. The logic circuitry 330 may determine a value 335 stored by the memory cells within the memory array 370 based on the candidate values 315-*c* and the error quantities 320-*b*. For example, the logic circuitry 330 may determine the value 335 based on the candidate value 315-*c* associated with a lowest detected error quantity 320-*b*. Additionally, the logic circuitry 330 may determine the value 335 based on a mode value of the candidate value 315-*c* (e.g., a most occurrent value within the candidate values 315-*c*). The logic circuitry 330 may output the value 335. For example, the logic circuitry 330 may output the value 335 to input/output (e.g., as described with reference to FIG. 2). The memory 325 and the logic circuitry 330 may correspond to a parallel pipeline 345. That is, the memory 325 may communicate the candidate values 315-*c* and error quantities 320-*b* to the logic circuitry 330 in parallel (e.g., during a same or similar time intervals).

In some cases, the memory device 300 may perform an error correction operation on the value 335. For example, the memory device 300 may error correction circuitry (e.g., integrated with the error control circuitry 375, distinct from the error control circuitry 375). In this case, the memory device may correct one or more errors detected within the value 335 (e.g., prior to transmitting the value 335 to the host device).

Figure 4:
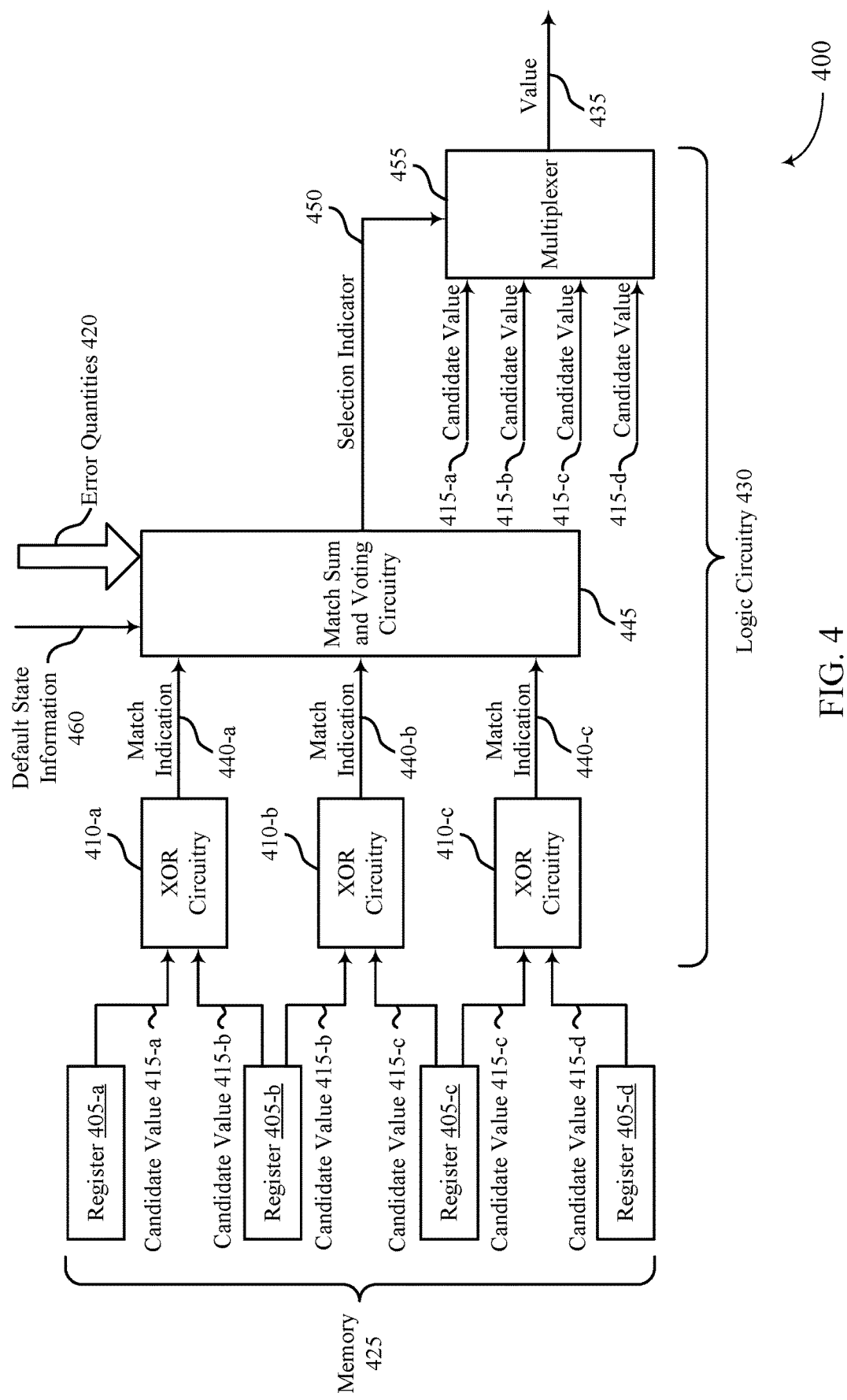
FIG. 4 illustrates an example of a system that supports a read algorithm for a memory device in accordance with examples as disclosed herein.

FIG. 4 illustrates an example of a system 400 that supports a read algorithm for a memory device in accordance with examples as disclosed herein. The system 400 may include memory 425 and logic circuitry 430, which may be examples of the memory and logic circuitry as described with reference to FIGS. 2 and 3. The memory 425 may include a set of registers 405. The logic circuitry 430 may include a set of exclusive-OR (XOR) circuitry 410, match sum and voting circuitry 445, and a multiplexer 455. In some cases, the logic circuitry 430 may illustrate an example configuration of the logic circuitry. In some cases, the logic circuitry 430 may include different components, additional components, or may be integrated with another component of a memory device (e.g., a device memory controller, a local memory controller).

Each register within the memory 425 may store a candidate value 415 and a detected error quantity 420 associated with the candidate value 415. For example, register 405-*a* may store the candidate value 415-*a* and an error quantity 420 associated with the candidate value 415-*a*. Each register 405 may additionally be associated with a distinct reference threshold. For example, register 405-*b* may store a candidate value 415-*b* associated with a first reference threshold and register 405-*c* may store a candidate value 415-*c* associated with a second reference threshold. Here, the memory 425 is illustrated is as including four registers 405 (e.g., associated with four distinct reference thresholds). In some other examples, a different quantity of reference thresholds may be used when performing a read operation. Here, the memory 425 may include a different quantity of registers 405 (e.g., corresponding to the quantity of reference thresholds used when performing the read operation). In some cases, the memory 425 may include a large quantity of registers 405 and may utilize a subset of the registers 405, where a quantity of registers 405 in the subset corresponds to a quantity of reference thresholds used for the read operation. In some examples, the registers 405 may be arranged according to a voltage level of the corresponding reference voltage. That is, register 405-*a* may be associated with a reference threshold having a lowest voltage and register 405-*d* may be associated with a reference threshold having a highest voltage.

The memory 425 may communicate the candidate values 415 to the XOR circuitry 410. Each XOR circuitry 410 may receive two candidate values 415 and output a match indication 440. The match indication 440 may indicate whether the two candidate values 415 are the same or different. For example, if the XOR circuitry 410 receives to candidate values 415 that are the same, the XOR circuitry 410 may output a match indication 440 indicating that the two candidate values 415 are the same (e.g., a logic value '0'). In another example, if the XOR circuitry 410 receives two candidate values 415 that are different, the XOR circuitry 410 may output a match indication 440 indicating that the two candidate values 415 are different (e.g., a logic value '1'). For example, XOR circuitry 410-*a* may compare candidate value 415-*a* and candidate value 415-*b*. If the candidate values 415-*a* and 415-*b* match, the XOR circuitry 410-*a* may output a match indication 440-*a* with a first logic value (e.g., a logic value '0'). Alternatively, if the candidate values 415-*a* and 415-*b* are different, the XOR circuitry 410-*a* may output a match indication 440-*a* with a second logic value (e.g., a logic value '1').

The XOR circuitry 410 may output match indications 440 to the match sum and voting circuitry 445. The match sum and voting circuitry 445 may additionally receive the error quantities 420 (e.g., from each of the registers 405 within the memory 425). The match sum and voting circuitry 445 may determine, based on receiving the match indications 440 and the error quantities 420, a candidate value 415 most likely associated with a value stored by the one or more memory cells (e.g., sensed during a read operation). The match sum and voting circuitry 445 may output a selection indicator 450 indicating the selected candidate value 415 to the multiplexer 455. The multiplexer 455 may receive each of the candidate values 415 (e.g., from the registers 405) and output the value 435 based on the candidate value 415 indicated by the selection indicator 450.

The match sum and voting circuitry 445 may determine a candidate value 415 associated with a lowest quantity of detected errors (e.g., the lowest error quantity 420). For example, the match sum and voting circuitry may determine that candidate value 415-*c* is associated with one detected error (e.g., based on the error quantity 420 associated with the candidate value 415-*c*). Additionally, the match sum and voting circuitry 445 may determine that the remaining candidate values 415 are each associated with more than one detected error. In this example, the match sum and voting circuitry 445 may output a selection indicator 450 associated with the candidate value 415 with one detected error.

In other cases, there may be more than one candidate value 415 associated with a lowest quantity of detected errors. For example, the error quantities 420 may indicate that two, three, or four of the candidate values 415 are associated with a single error while any remaining candidate values 415 are associated with more than one error. Here, the match sum and voting circuitry 445 may output a selection indicator 450 indicating a candidate value 415 associated with a mode candidate value 415. For example, if the error quantities 420 indicate that each of the candidate values 415 include a single detected error, the match sum and voting circuitry 445 may determine that candidate values 415-*b*, 415-*c*, and 415-*d* each correspond to the most occurrent or mode candidate value 415 while candidate value 415-*a* is different than the remaining candidate values 415. That is, the match indication 440-*a* may indicate that candidate values 415-*a* and 415-*b* are different, while match indications 440-*b* and 440-*c* may indicate that candidate values 415-*b*, 415-*c*, and 415-*d* are the same. Here, the match sum and voting circuitry 445 may select a candidate value 415 from the candidate values 415-*b*, 415-*c*, and 415-*d*.

In cases where the match sum and voting circuitry 445 identifies more than one candidate value 415 associated with a lowest quantity of detected errors and having the mode value, the match sum and voting circuitry 445 may select a candidate value 415 based on the default state information 460. The default state information 460 may indicate the candidate value 415 to select in equiprobable states (e.g., when the match sum and voting circuitry 445 identifies more than one candidate value 415 associated with a lowest quantity of detected errors and having the mode value). For example, the default state information 460 may identify an order for selecting the candidate values 415 in the case of equiprobable states.

In some cases, the functions described herein may be performed by different components or analogs of the components described. For example, the functions of the XOR circuitry 410 and/or the match sum and voting circuitry 445 may be performed by different components. The XOR circuitry 410 and the match sum and voting circuitry 445 are an example of a configuration of hardware that can perform the functions described herein.

Figure 5:
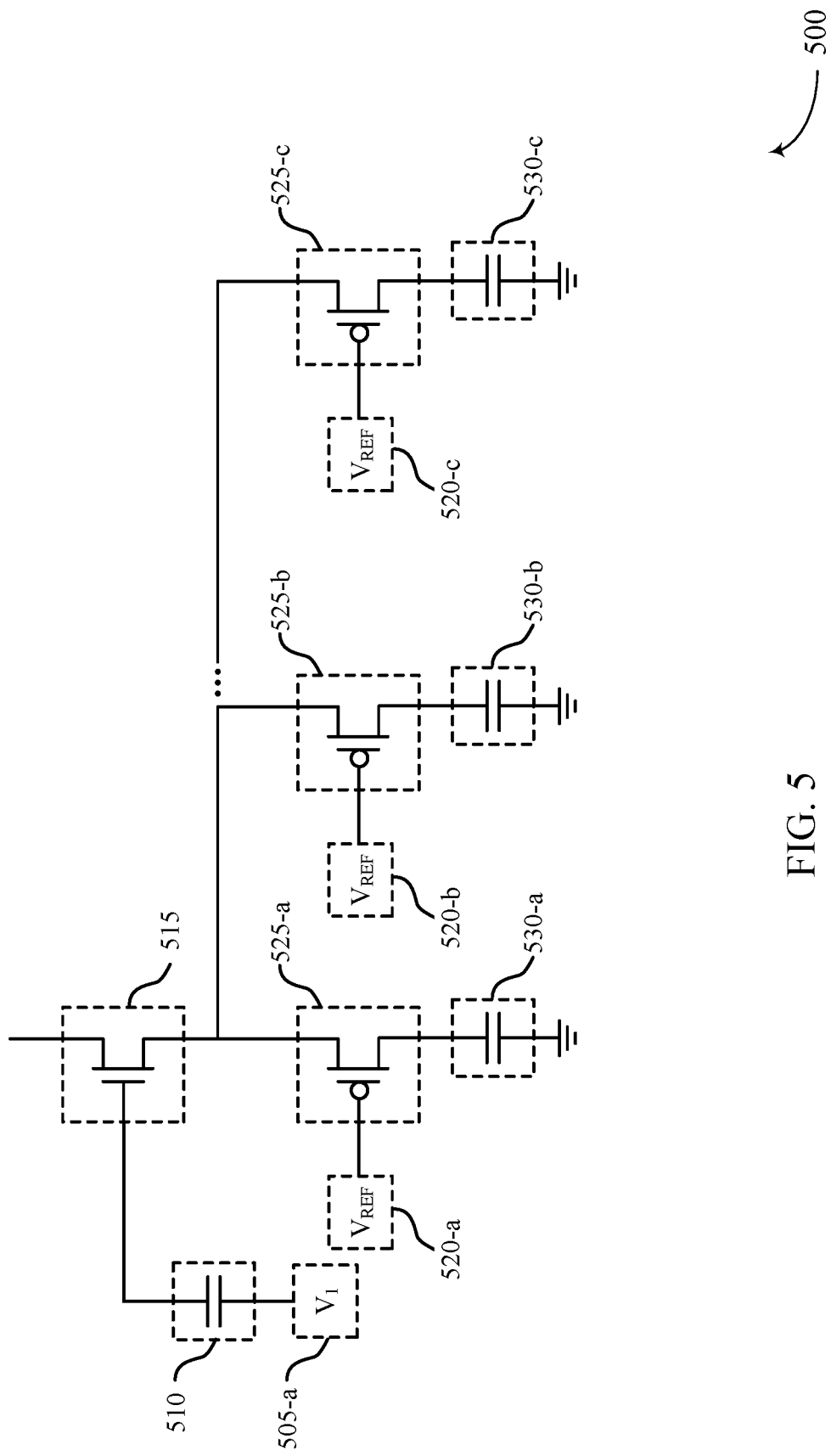
FIG. 5 illustrates an example of a circuit that supports a read algorithm for a memory device in accordance with examples as disclosed herein.

FIG. 5 illustrates an example of a circuit 500 that supports a read algorithm for a memory device in accordance with examples as disclosed herein. In some cases, the circuit 500 may illustrate aspects of a sense component and sense amplifier as described herein. The circuit 500 may include an amplifier capacitor 510 (AMPCAP), a first transistor 515, reference thresholds 520, and a plurality of second transistors 525. In some cases, the second transistors may be examples of amplifiers.

The AMPCAP 510 may be selectively coupled with a voltage source 505-*a* having a voltage $V_1$. The AMPCAP 510 may store a charge of the memory cell and may output a signal (e.g., a charge signal, a voltage signal, or both) to the transistor 515 that is based on the charge extracted from a memory cell during an access operation. The transistor 515 may output the signal to each of the plurality of second transistors 525 during the read operation. Circuit 500 illustrates an example where the circuit includes three of the second transistors 525, but in some cases, a memory device may include a circuit 500 including more or less of the plurality of second transistors 525. Each transistor 525 may have a reference threshold 520 (e.g., a reference voltage) coupled with the gate of the transistor 525. In a case that the signal (e.g., output by the AMPCAP 510) is greater than the reference threshold 520 applied to the gate of the transistor 525, the transistor 525 may turn on (e.g., enable a flow of charge through the transistor 525) and output an amplified signal to a capacitor 530.

The combination of the signal applied to the gate of the first transistor 515 by the AMPCAP 510 and the reference thresholds 520 applied to the gate of the transistors 525 may be used to concurrently compare the signal from the memory cell to different reference thresholds. For example, the transistor 525 may not turn on and may not enable a flow of charge through the transistor 525 based on the value applied to the gate of the first transistor 515 and the value applied to the gate of a given second transistor 525. In some cases, the capacitor 530 may remain uncharged (e.g., storing a voltage equal to or approximately equal to a ground voltage of the circuit 500). In some cases, the capacitors 530 may each be configured to store a candidate value associated with the reference threshold 520.

In some cases, each of the reference thresholds 520 applied to the gates of the plurality of second transistors 525 may be different. For example, a first reference threshold 520-*a* may be equal to 1.3V, a second reference threshold 520-*b* may be equal to 1.5V, and a third reference threshold 520-*c* may be equal to 1.7V. Applying the different reference thresholds 520 to the gates of each transistor 525 may result in a subset of the transistors turning on and a subset of the amplifiers not turning on. For example, if the signal output by the AMPCAP 510 is $1.4V+2V_T$ (e.g., a threshold voltage associated with the transistor 525-*a*), the transistor 525-*a* may turn on (e.g., resulting in an amplified signal being stored by the capacitor 530-*a*) while the remaining transistors 525-*b* and 525-*c* may remain off.

During a read operation, the transistors 525 may receive the signal from the AMPCAP 510 at approximately a same time, and turn on or remain off based on a difference between the signal and the reference threshold 520 at approximately the same time. Thus, the circuit 500 may output each of the candidate values to the capacitors 530 in parallel.

Figure 6:
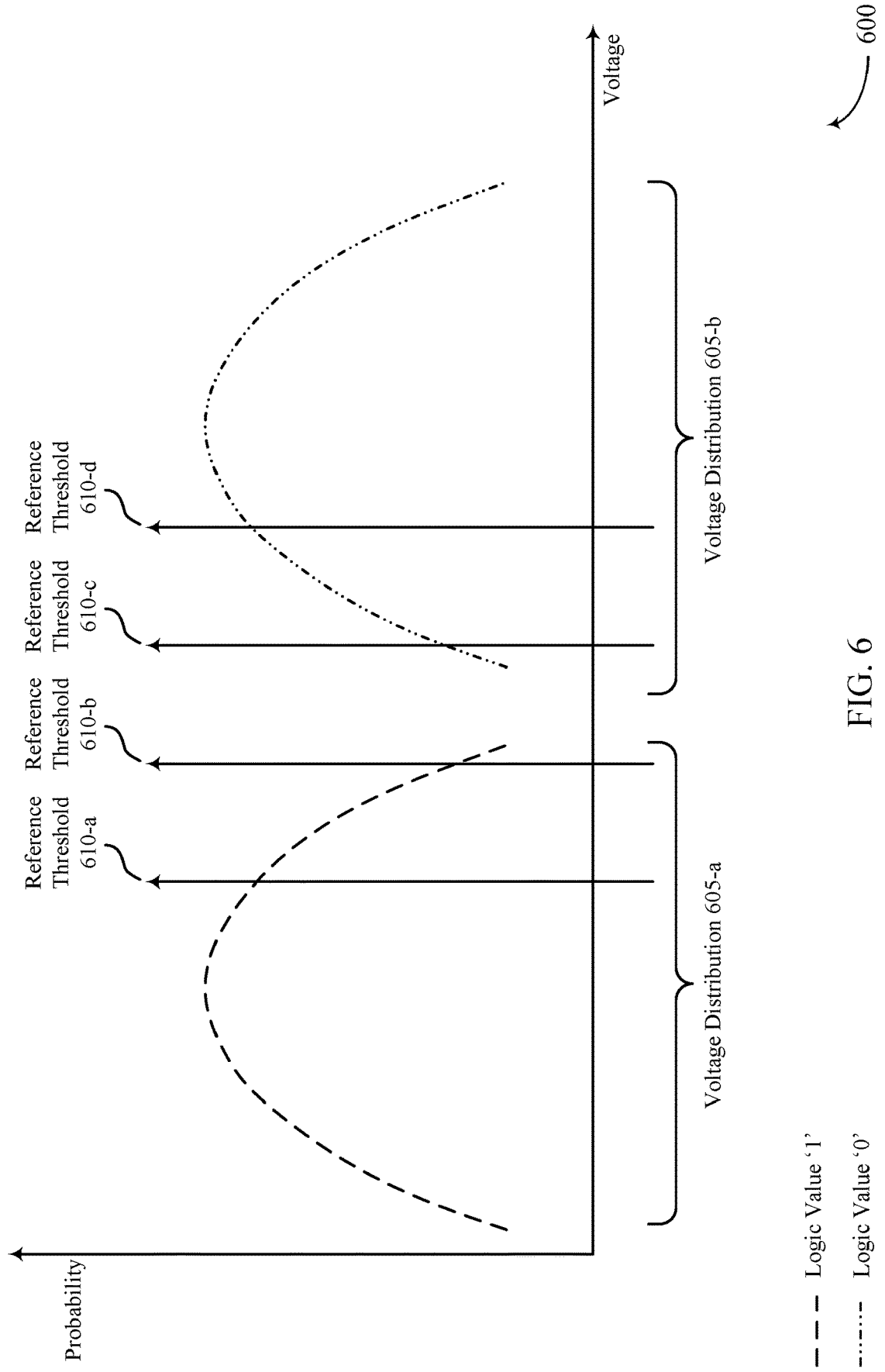
FIG. 6 illustrates an example of a voltage distribution plot that supports a read algorithm for a memory device in accordance with examples as disclosed herein.

FIG. 6 illustrates an example of a voltage distribution plot 600 that supports a read algorithm for a memory device in accordance with examples as disclosed herein. The voltage distribution plot 600 illustrates a voltage distribution 605-*a* associated with a signal output by a memory cell storing a logic value '1' and a voltage distribution 605-*b* associated with a signal output by a memory cell storing a logic value '0.' The voltage distribution plot 600 also illustrates an example set of reference thresholds 610. In some cases, a memory device may perform a read operation on a set of memory cells using each of the reference thresholds 610.

During a read operation, a memory array may output a set of signals based on the logic value being stored by the accessed memory cells. A sense amplifier may receive the set of signals and output a set of candidate values, each associated with one of the reference thresholds 610. In the example of voltage distribution plot 600, the sense amplifier may output a candidate value with a logic value '1' if the signal is less than the reference threshold 610. Additionally, the sense amplifier may output a candidate value with a logic value '0' if the signal has a voltage that is greater than the reference threshold 610. In other examples, the sense amplifier may instead output a candidate value with a logic value '1' if the signal is greater than the reference threshold 610 and output a candidate value with a logic value '0' if the signal is less than the reference threshold. In the example of voltage distribution plot 600, if a memory cell storing a logic value '1' outputs a signal with a voltage less than the reference threshold 610-a, the candidate value associated with each of the reference thresholds 610 may be a logic value '1.' Additionally, if a memory cell storing a logic value '0' outputs a signal with a voltage greater than the reference threshold 610-d, the candidate value associated with each of the reference thresholds 610 may be a logic value '0.'

The sense amplifier may output the set of candidate values to error control circuitry, which may detect a quantity of errors associated with each candidate value. For example, if each memory cell within a set of memory cells storing a logic value '1' outputs signals with voltages less than the reference threshold 610-a and each memory cell within the set of memory cells storing a logic value '0' outputs signals with voltages greater than the reference threshold 610-d, each candidate value output by the sense amplifier may be correct. Here, the error control circuitry may perform an error control operation on a first candidate value (e.g., the candidate value associated with the reference threshold 610-a) and may detect no errors. Thus, the memory device may determine the value stored by the set of memory cells and output that value.

In another example, one of the memory cells within the set of memory cells storing a logic value '1' may output a signal with a voltage level between the reference threshold 610-a and 610-b (e.g., instead of with a voltage level less than the reference threshold 610-a). Here, the candidate value associated with the reference threshold 610-a may contain one error (e.g., the candidate value may include an extra bit with a logic value '0'). Here, the error control circuitry may perform an error control operation on the first candidate value associated with the reference threshold 610-a and detect a single error. The error control circuitry may then perform an error control operation on the second candidate value associated with the reference threshold 610-b and detect no errors. Thus, the memory device may determine the value stored by the set of memory cells based on the candidate value associated with the reference threshold 610-b and output that value.

In another example, one of the memory cells within the set of memory cells storing a logic value '0' may output a signal with a voltage level between reference threshold 610-a and reference threshold 610-b. Additionally, one of the memory cells within the set of memory cells storing a logic value '1' may output a signal with a voltage level between reference threshold 610-a and reference threshold 610-b. Here, the candidate value associated with the reference threshold 610-a may contain one error. That is, the candidate value associated with the reference threshold 610-a may include an extra bit with a logic value '0.' Additionally, the candidate values associated with the reference thresholds 610-b, 610-c, and 610-d may each include an extra bit with a logic value '1.' Here, the error control circuitry may perform an error control operation on the each of the candidate values and detect an error in each of the candidate values. The error control circuitry may output the candidate values to the logic circuitry. The logic circuitry may determine the mode value within the set of candidate values (e.g., the value associated with the reference thresholds 610-b, 610-c, and 610-d). Here, the logic circuitry may output the mode value within the set of candidate values.

In another example, one of the memory cells within the set of memory cells storing a logic value '0' (e.g., cell A) may output a signal with a voltage level less than the reference threshold 610-a. Additionally, another of the memory cells within the set of memory cells storing a logic value '0' (e.g., cell B) may output a signal with a voltage level between reference threshold 610-a and reference threshold 610-b. Here, the candidate value associated with the reference threshold 610-a may contain include an extra bit with a logic value '1.' Additionally, the candidate values associated with the reference thresholds 610-b, 610-c, and 610-d may include two additional bits with a logic value '1.' Here, the sense amplifier may communicate the candidate values to the error control circuitry. The error control circuitry may perform an error control operation on the each of the candidate values and detect one error in the candidate value associated with the reference threshold 610-a and two errors in the candidate values associated with the reference thresholds 610-b, 610-c, and 610-d. The error control circuitry may output the candidate values to the logic circuitry. The logic circuitry may determine that the candidate value associated with the reference threshold 610-a includes the least quantity of errors and will therefore output the value associated with that candidate value.

Figure 7:
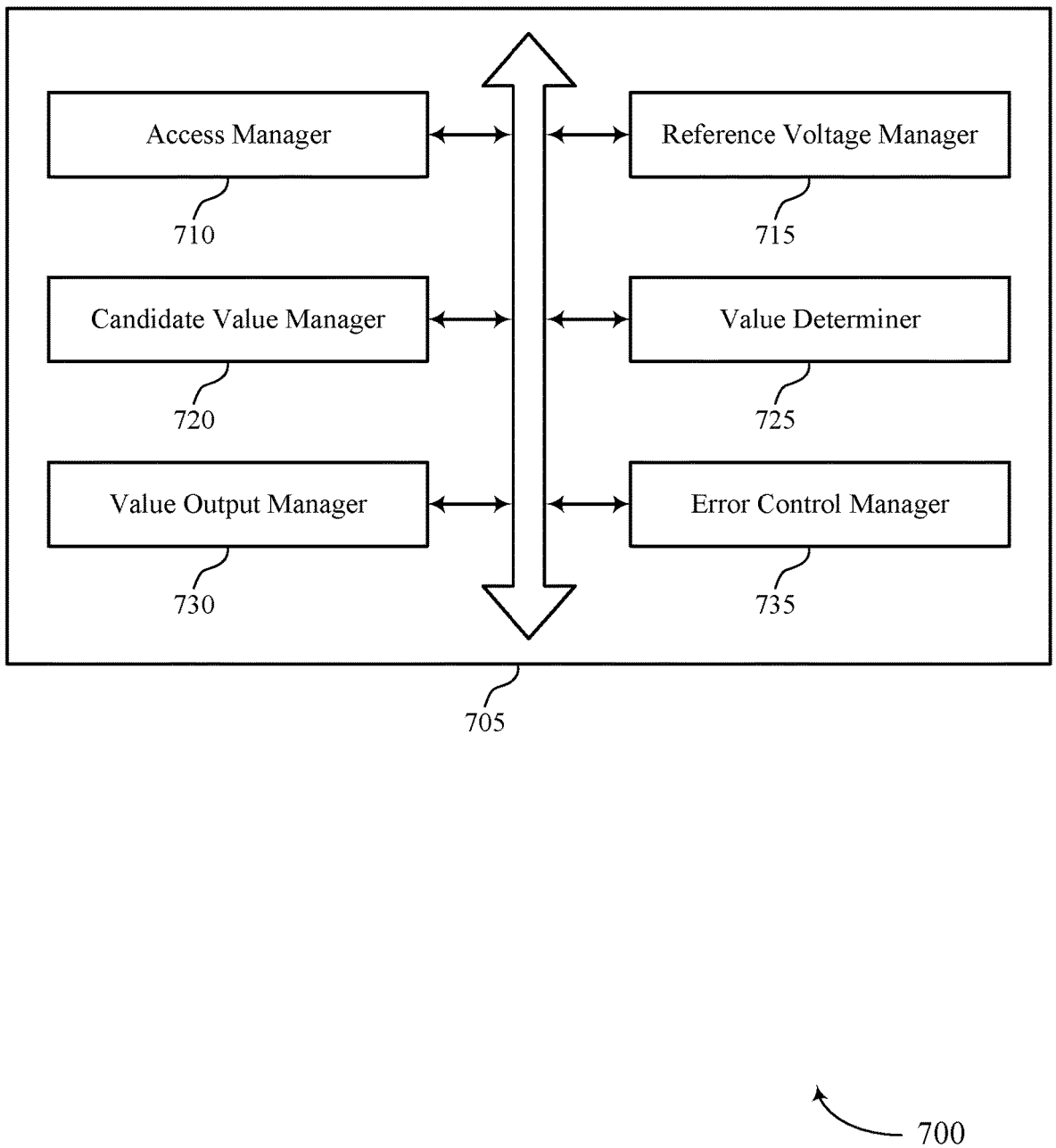
FIG. 7 shows a block diagram of a memory device that supports a read algorithm for a memory device in accordance with examples as disclosed herein.

FIG. 7 shows a block diagram 700 of a memory device 705 that supports a read algorithm for a memory device in accordance with examples as disclosed herein. The memory device 705 may be an example of aspects of a memory device as described with reference to FIGS. 1 through 6. The memory device 705 may include an access manager 710, a reference voltage manager 715, a candidate value manager 720, a value determiner 725, a value output manager 730, and an error control manager 735. Each of these components may communicate, directly or indirectly, with one another (e.g., via one or more buses).

The access manager 710 may access a memory cell to retrieve a value stored by the memory cell.

The reference voltage manager 715 may compare a set of reference voltages with a signal output by the memory cell based on accessing the memory cell. In some examples, comparing the set of reference voltages with the signal output by the memory cell includes comparing each of the set of reference voltages with the signal output by the memory cell in parallel. In some cases, comparing the set of reference voltages with the signal output by the memory cell includes serially comparing each of the set of reference voltages with the signal output by the memory cell.

The candidate value manager 720 may determine a set of candidate values stored by the memory cell based on comparing the set of reference voltages with the signal. In some cases, each of the set of candidate values is associated with one of the set of reference voltages. In some examples, the candidate value manager 720 may identify one or more candidate values of the set of candidate values containing no detected errors based on performing an error detection operation, where the determined value stored by the memory cell corresponds to one of the one or more candidate values identified as containing no detected errors. In some cases, the candidate value manager 720 may identify one or more candidate values of the set of candidate values containing one detected error based on performing the error detection operation, where the determined value stored by the memory cell corresponds to one of the one or more candidate values identified as containing one detected error.

In some instances, the candidate value manager 720 may identify a mode value within the set of candidate values, where the determined value stored by the memory cell is based on identifying the mode value of the set of candidate values. In some examples, the candidate value manager 720 may identify the mode value within the set of candidate values is based on determining whether each of the set of candidate values is a same value as at least one other candidate value of the set of candidate values.

The value determiner 725 may determine the value stored by the memory cell based on determining the set of candidate values.

The value output manager 730 may output the value stored by the memory cell based on determining the value based on the set of candidate values.

The error control manager 735 may perform the error detection operation on each of the set of candidate values to detect a quantity of errors within each of the set of candidate values, where determining the value stored by the memory cell is based on performing the error detection operation. In some examples, the error control manager 735 may determine that each of the set of candidate values contains at least one detected error based on performing the error detection operation.

Figure 8:
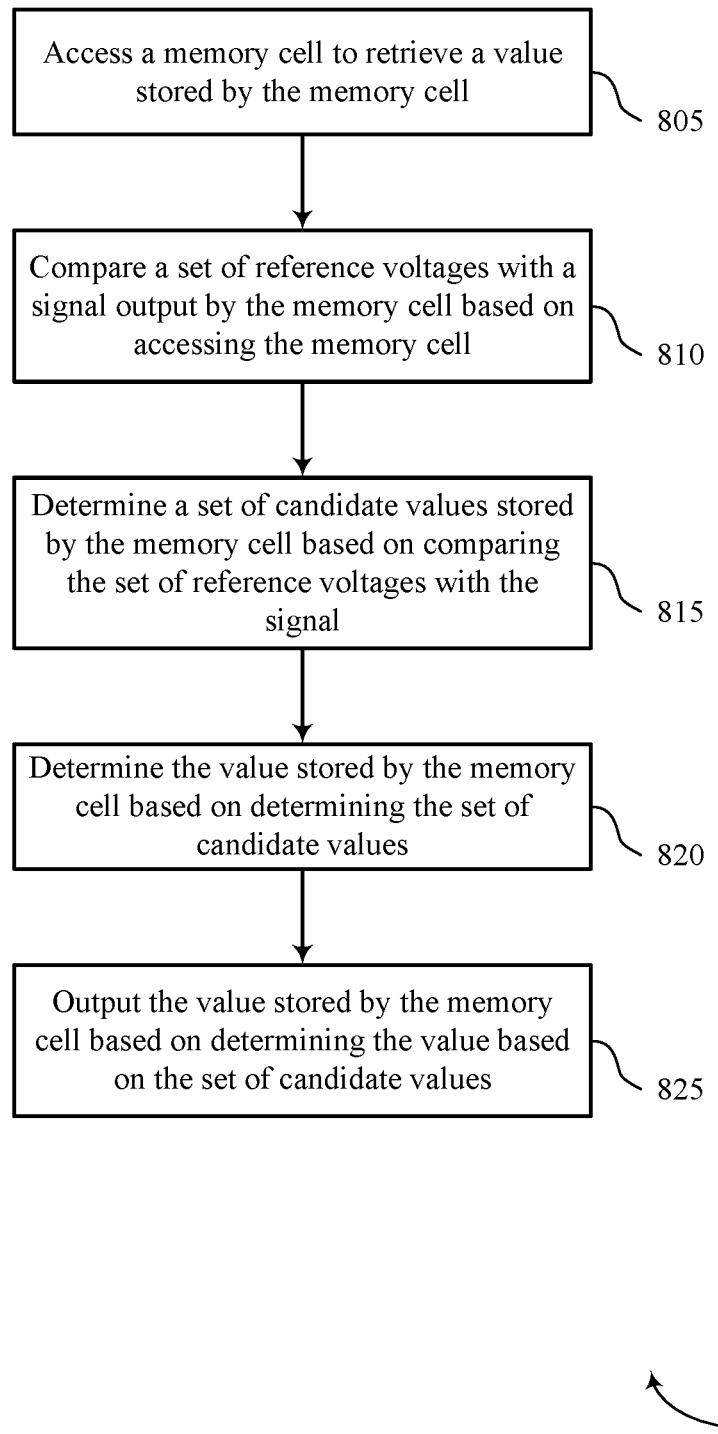
FIG. 8 shows a flowchart illustrating a method or methods that support a read algorithm for a memory device in accordance with examples as disclosed herein.

FIG. 8 shows a flowchart illustrating a method or methods 800 that supports a read algorithm for a memory device in accordance with examples as described herein. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may access a memory cell to retrieve a value stored by the memory cell. The operations of 805 may be performed according to the methods described herein. In some examples, aspects of the operations of 805 may be performed by an access manager as described with reference to FIG. 7.

At 810, the memory device may compare a set of reference voltages with a signal output by the memory cell based on accessing the memory cell. The operations of 810 may be performed according to the methods described herein. In some examples, aspects of the operations of 810 may be performed by a reference voltage manager as described with reference to FIG. 7.

At 815, the memory device may determine a set of candidate values stored by the memory cell based on comparing the set of reference voltages with the signal. The operations of 815 may be performed according to the methods described herein. In some examples, aspects of the operations of 815 may be performed by a candidate value manager as described with reference to FIG. 7.

At 820, the memory device may determine the value stored by the memory cell based on determining the set of candidate values. The operations of 820 may be performed according to the methods described herein. In some examples, aspects of the operations of 820 may be performed by a value determiner as described with reference to FIG. 7.

At 825, the memory device may output the value stored by the memory cell based on determining the value based on the set of candidate values. The operations of 825 may be performed according to the methods described herein. In some examples, aspects of the operations of 825 may be performed by a value output manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for accessing a memory cell to retrieve a value stored by the memory cell, comparing a set of reference voltages with a signal output by the memory cell based on accessing the memory cell, determining a set of candidate values stored by the memory cell based on comparing the set of reference voltages with the signal, determining the value stored by the memory cell based on determining the set of candidate values, and outputting the value stored by the memory cell based on determining the value based on the set of candidate values.

Some cases of the method 800 and the apparatus described herein may further include operations, features, means, or instructions for performing an error detection operation on each of the set of candidate values to detect a quantity of errors within each of the set of candidate values, where determining the value stored by the memory cell may be based on performing the error detection operation.

Some instances of the method 800 and the apparatus described herein may further include operations, features, means, or instructions for identifying one or more candidate values of the set of candidate values containing no detected errors based on performing the error detection operation, where the determined value stored by the memory cell corresponds to one of the one or more candidate values identified as containing no detected errors.

Some examples of the method 800 and the apparatus described herein may further include operations, features, means, or instructions for determining that each of the set of candidate values contains at least one detected error based on performing the error detection operation, and identifying one or more candidate values of the set of candidate values containing one detected error based on performing the error detection operation, where the determined value stored by the memory cell corresponds to one of the one or more candidate values identified as containing one detected error.

Some cases of the method 800 and the apparatus described herein may further include operations, features, means, or instructions for identifying a mode value within the set of candidate values, where the determined value stored by the memory cell may be based on identifying the mode value of the set of candidate values.

Some instances of the method 800 and the apparatus described herein may further include operations, features, means, or instructions for identifying the mode value within the set of candidate values may be based on determining whether each of the set of candidate values may be a same value as at least one other candidate value of the set of candidate values.

In some examples of the method 800 and the apparatus described herein, each of the set of candidate values may be associated with one of the set of reference voltages.

In some cases of the method 800 and the apparatus described herein, comparing the set of reference voltages with the signal output by the memory cell may include operations, features, means, or instructions for comparing each of the set of reference voltages with the signal output by the memory cell in parallel.

Some instances of the method 800 and the apparatus described herein may further include operations, features, means, or instructions for comparing the set of reference voltages with the signal output by the memory cell includes serially comparing each of the set of reference voltages with the signal output by the memory cell.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array, a sense amplifier coupled with the memory array, a set of registers coupled with the sense amplifier, and a control component coupled with the set of registers. The sense amplifier may be configured to compare a signal output by a memory cell of the memory array with a set of reference voltages. Additionally, the sense amplifier may include a set of transistors each associated with a different reference voltage of the set of reference voltages. The set of registers may be configured to store a set of data sets read from the memory array as part of a read operation. Additionally, the control component may be configured to cause the apparatus to determine a data set stored by the memory array based at least in part the set of data sets read from the memory array and output the data set stored by the memory array based on determining the data set stored by the memory array.

Some examples of the apparatus may include error detection circuitry (e.g., coupled with the control component) configured to cause the apparatus to perform an error detection operation on each of the set of data sets read from the memory array to detect a quantity of errors within each of the set of data sets, and output the detected quantity of errors within each of the set of data sets to the control component. In some cases, determining the data set stored by the memory array may be based on the error detection circuitry outputting the detected quantity of errors to the control component.

In some cases, the control component may be further configured to cause the apparatus to identify one or more data sets of the set of data sets containing no detected errors based on the error detection circuitry outputting the detected quantity of errors within each of the set of data sets, where the determined data set stored by the memory array corresponds to one of the one or more data sets identified as containing no detected errors.

In some instances, the control component may be further configured to cause the apparatus to determine that each of the set of data sets contains at least one detected error based on the error detection circuitry outputting the detected quantity of errors within each of the set of data sets, and identify one or more data sets of the set of data sets containing one detected error based on the error detection circuitry outputting the detected quantity of errors within each of the set of data sets, where the determined data set stored by the memory array corresponds to one of the one or more data sets identified as containing one detected error.

In some examples, the control component may be further configured to cause the apparatus to identify a mode data set within the set of data sets, where the determined data set stored by the memory array may be based on identifying the mode data set within the set of data sets.

In some cases, identifying the mode data set within the set of data sets may be based on determining whether each of the set of data sets may be a same data set as at least one other data set of the set of data sets.

In some instances, each data set of the set of data sets may be associated with one reference voltage of the set of reference voltages.

In some examples, the set of transistors may be arranged in parallel within the sense amplifier.

An apparatus is described. The apparatus may include a memory array and a control component coupled with the memory array. The control component may be operable to cause the apparatus to compare a set of reference voltages with a signal output by the memory cell based on accessing the memory cell, determine a set of candidate values stored by the memory cell based on comparing the set of reference voltages with the signal, determine the value stored by the memory cell based on determining the set of candidate values, and output the value stored by the memory cell based on determining the value based on the set of candidate values.

In some examples, the control component may be further operable to cause the apparatus to perform an error detection operation on each of the set of candidate values to detect a quantity of errors within each of the set of candidate values, where determining the value stored by the memory cell may be based on performing the error detection operation.

In some cases, the control component may be further operable to cause the apparatus to identify one or more candidate values of the set of candidate values containing no detected errors based on performing the error detection operation, where the determined value stored by the memory cell corresponds to one of the one or more candidate values identified as containing no detected errors.

In some instances, the control component may be further operable to cause the apparatus to determine that each of the set of candidate values contains at least one detected error based on performing the error detection operation, and identify one or more candidate values of the set of candidate values containing one detected error based on performing the error detection operation, where the determined value stored by the memory cell corresponds to one of the one or more candidate values identified as containing one detected error.

Some examples may further include identifying a mode value within the set of candidate values, where the determined value stored by the memory cell may be based on identifying the mode value of the set of candidate values.

In some cases, identifying the mode value within the set of candidate values may be based on determining whether each of the set of candidate values may be a same value as at least one other candidate value of the set of candidate values.

In some instances, each of the set of candidate values may be associated with one of the set of reference voltages.

In some examples, comparing the set of reference voltages with the signal output by the memory cell may include operations, features, means, or instructions for comparing each of the set of reference voltages with the signal output by the memory cell in parallel.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "concurrent" or "concurrently" used herein refer to actions that are at least partially overlapping in time. The terms "simultaneous" or "simultaneously" used herein refer to actions that occur at a same time and, in some examples, begin at a same time, occur for a same duration, and end a same time. Concurrent actions may also be simultaneous actions.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    outputting, to an error control circuit of a memory device, a set of candidate values stored by a memory cell of the memory device, the set of candidate values determined based at least in part on comparing a plurality of reference thresholds with a signal output by the memory cell;
    detecting a respective quantity of errors of a set of quantities of errors for each candidate value of the set of candidate values;
    determining a value stored by the memory cell based at least in part on selecting a candidate value from the set of candidate values using the set of quantities of errors, the value corresponding to the candidate value; and
    outputting the value stored by the memory cell based at least in part on determining the value.

2. The method of claim 1, further comprising:
    performing, by the error control circuit of the memory device, an error control operation, wherein detecting the quantity of errors associated with each candidate value is based at least in part on performing the error control circuit.

3. The method of claim 2, wherein performing the error control operation comprises:
    performing a first error control operation on a first candidate value of the set of candidate values;
    detecting a quantity of errors associated with the first candidate value; and
    performing a second error control operation on a second candidate value of the set of candidate values after outputting the first candidate value and the quantity of errors associated with the first candidate value to a memory of the memory device.

4. The method of claim 3, comprising:
    detecting that the quantity of errors associated with the first candidate value is zero; and
    refraining from performing additional error control operations on remaining candidate values of the set of candidate values.

5. The method of claim 2, further comprising:
    outputting, to a memory of the memory device and after performing the error control operation, the set of candidate values and the quantity of errors corresponding to each candidate value of the set of candidate values.

6. The method of claim 5, further comprising:
    outputting, from the memory of the memory device to a logic circuit of the memory device, the set of candidate values and the quantity of errors corresponding to each candidate value of the set of candidate values in parallel.

7. The method of claim 6, further comprising:
    detecting that the quantity of errors associated with each candidate value of the set of candidate values is greater than zero; and
    determining, by the logic circuit of the memory device, the value stored by the memory cell based at least in part on a candidate value of the set of candidate values associated with a smallest quantity of detected errors or a mode quantity of detected errors in the set of candidate values.

8. The method of claim 1, wherein outputting the set of candidate values to the error control circuit comprises:
    outputting the set of candidate values sequentially.

9. The method of claim 1, further comprising:
    storing the set of candidate values and the quantity of errors corresponding to each candidate value of the set of candidate values in a set of one or more registers.

10. The method of claim 9, wherein the memory device is a scratch memory device.

11. An apparatus, comprising:
    a memory array;
    error control circuitry; and
    a control component coupled with the error control circuitry and configured to cause the apparatus to:
        output, to the error control circuitry, a set of candidate values stored by the memory array, the set of candidate values determined based at least in part on comparing a plurality of reference thresholds with a signal output by the memory array;
        detect a respective quantity of errors of a set of quantities of error for each candidate value of the set of candidate values;
        determine a value stored by the memory cell based at least in part on selecting a candidate value from the set of candidate values using the set of quantities of errors, the value corresponding to the candidate value; and
        output the value stored by the memory array based at least in part on determining the value.

12. The apparatus of claim 11, wherein the control component is further operable to cause the apparatus to:
    perform, by the error control circuitry of the apparatus, an error control operation, wherein detecting the quantity of errors associated with each candidate value is based at least in part on performing the error control circuitry.

13. The apparatus of claim 12, wherein the control component is further operable to cause the apparatus to:
    perform a first error control operation on a first candidate value of the set of candidate values;
    detect a quantity of errors associated with the first candidate value; and
    perform a second error control operation on a second candidate value of the set of candidate values after outputting the first candidate value and the quantity of errors associated with the first candidate value to a memory of the apparatus.

14. The apparatus of claim 13, wherein the control component is further operable to cause the apparatus to:
   detect that the quantity of errors associated with the first candidate value is zero; and
   refrain from performing additional error control operations on remaining candidate values of the set of candidate values.

15. The apparatus of claim 12, wherein the control component is further operable to cause the apparatus to:
   output, to a memory of the apparatus and after performing the error control operation, the set of candidate values and the quantity of errors corresponding to each candidate value of the set of candidate values.

16. The apparatus of claim 15, wherein the control component is further operable to cause the apparatus to:
   output, from the memory of the apparatus to the logic circuit, the set of candidate values and the quantity of errors corresponding to each candidate value of the set of candidate values in parallel.

17. The apparatus of claim 16, wherein the control component is further operable to cause the apparatus to:
   detecting that the quantity of errors associated with each candidate value of the set of candidate values is greater than zero; and
   determining, by the logic circuit of the apparatus, the value stored by the memory array based at least in part on a candidate value of the set of candidate values associated with a smallest quantity of detected errors or a mode quantity of detected errors in the set of candidate values.

18. The apparatus of claim 11, wherein the set of candidate values is output sequentially.

19. The apparatus of claim 11, further comprising:
   a set of registers configured to store the set of candidate values, wherein the control component is further operable to cause the apparatus to:
      storing the set of candidate values and the quantity of errors corresponding to each candidate value of the set of candidate values in a set of one or more registers.

20. An apparatus, comprising:
   a memory array; and
   a control component coupled with the memory array and operable to cause the apparatus to:
      output, to an error control circuit of a memory device, a set of candidate values stored by the memory array, the set of candidate values determined based at least in part on comparing a plurality of reference thresholds with a signal output by the memory array;
      detect a respective quantity of errors of a set of quantities of error for each candidate value of the set of candidate values;
      determine a value stored by the memory cell based at least in part on selecting a candidate value from the set of candidate values using the quantity set of quantities of errors, the value corresponding to the candidate value; and
      output the value stored by the memory array based at least in part on determining the value.

* * * * *